(12) United States Patent
Tsujimura

(10) Patent No.: US 7,405,514 B2
(45) Date of Patent: Jul. 29, 2008

(54) ORGANIC EL DISPLAY DEVICE WITH PLURAL ELECTRODE SEGMENTS

(75) Inventor: Hiroki Tsujimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/527,182

(22) Filed: Sep. 26, 2006

(65) Prior Publication Data

US 2007/0013298 A1    Jan. 18, 2007

Related U.S. Application Data

(62) Division of application No. 10/634,384, filed on Aug. 5, 2003, now Pat. No. 7,129,635.

(30) Foreign Application Priority Data

Aug. 6, 2002  (JP) ............................. 2002-228500
Aug. 28, 2002 (JP) ............................. 2002-248328

(51) Int. Cl.
    *H05B 33/00* (2006.01)
(52) U.S. Cl. ...................... 313/504; 313/498
(58) Field of Classification Search .......... 313/506–512
    See application file for complete search history.

(56) References Cited

U.S. PATENT DOCUMENTS

| 4,720,432 | A | 1/1988 | VanSlyke et al. |
| 6,307,528 | B1 | 10/2001 | Yap |
| 6,392,340 | B2 | 5/2002 | Yoneda et al. |
| 6,548,956 | B2 * | 4/2003 | Forrest et al. ............... 313/504 |
| 6,573,652 | B1 * | 6/2003 | Graff et al. ................... 313/512 |
| 6,882,102 | B2 * | 4/2005 | Yamazaki .................... 313/504 |
| 2001/0026123 | A1 * | 10/2001 | Yoneda ........................ 313/504 |

FOREIGN PATENT DOCUMENTS

| JP | 63-295695 | 12/1988 |
| JP | 09-212128 | 8/1997 |
| JP | 10-308284 | 11/1998 |
| JP | 11-251059 | 9/1999 |
| JP | 11-354279 | 12/1999 |
| JP | 2001-507503 | 6/2001 |
| JP | 2001-319789 | 11/2001 |
| JP | 2002-117985 | 4/2002 |
| JP | 2003-243182 | 8/2003 |
| WO | WO 98/28947 | 7/1998 |

* cited by examiner

*Primary Examiner*—Joseph L Williams
(74) *Attorney, Agent, or Firm*—Hamre, Schumann, Mueller & Larson, P.C.

(57) ABSTRACT

The present invention relates to a display device (1A) including a plurality of display elements (10A) formed on a substrate (2A). Each of the display elements (10A) includes an organic segment (4A) containing an organic compound which generates light upon application of an electric field, and a first and a second electrode elements (3A, 5A) for applying the electric field to the organic segment (4A). The first electrode segment (3A), the organic segment (4A) and the second electrode segment (4A) are formed on the substrate (2A). In this case, the second electrode segment (5A) is provided with an opening (52A) for allowing passage of light generated in the organic segment (4A). The first and second electrode segments may be formed adjacent to each other in a plane parallel to the substrate. In this case, the organic segment is formed so as to cover both the first and second electrode elements.

9 Claims, 7 Drawing Sheets

ORGANIC EL DISPLAY DEVICE WITH PLURAL ELECTRODE SEGMENTS

This application is a division of 10/634,384, filed Aug. 5, 2003, which application is incorporated herein by reference.

BACKGROUND OF THE INVENTION

1. Technical Field of the Invention

The present invention relates to an organic electroluminescent (EL) display device utilizing an electroluminescence of an organic compound to display images.

2. Description of the Related Art

An organic EL display device is a device having a plurality of display elements arranged in a matrix pattern for displaying an image by selectively actuating the individual display elements for light emission. As shown in FIG. 7 illustrating an example, a display element 9 includes a transparent electrode segment 91, an organic laminate 92, and a reflective electrode segment 93 successively formed on a glass substrate 90 in the mentioned order. The transparent electrode segment 91, serving as an anode, is made of e.g. ITO. The organic laminate 92 includes a light emitting layer 92A which emits light upon application of a voltage. In the illustrated example, the organic laminate 92 further includes a hole transport layer 92B and an electron transport layer 92C in addition to the light emitting layer 92A. The reflective electrode segment 93, serving as a cathode, is made of e.g. a highly reflective material such as aluminum or copper.

The display element 9 generates light in the light emitting layer 92A by applying a voltage across the organic laminate 92 utilizing the transparent electrode segment 91 and the reflective electrode segment 93. The light generated in the light emitting layer 92A propagates in directions Z1, Z2 of FIG. 7. The light component propagating in the direction Z1 passes through the hole transport layer 92B, the transparent electrode segment 91 and the glass substrate 90 to be emitted out of the display element 9. The light component propagating in the direction Z2 passes through the electron transport layer 92C, reflects at the reflective electrode segment 93, and then goes back through the organic laminate 92, the transparent electrode segment 91 and the glass substrate 90 for exiting out of the display element 9.

Thus, the display element 9 can emit only the light component passing through the glass substrate 90 after passing through at least the hole transport layer 92B and the transparent electrode segment 91. Consequently, only a single surface can be utilized as a displaying face in the organic EL display device incorporating the above-described display element 9.

In addition, the light generated in the light emitting layer 92A has to pass through many elements before exiting out of the display element 9, so that some portion of light cannot be utilized due to absorption before emission.

In order to achieve a double-face display in an organic EL display device, it is conceivable to provide both of the anode segment and the cathode segment of the display element as transparent electrodes, for example. In this case, when both the anode segment and the cathode segment are made of ITO, a high driving voltage is needed due to a relatively large resistance of ITO. Further, since ITO tends to transmit a long-wavelength component of visible light more easily than a short-wavelength light component, light emitted from the display element becomes reddish to adversely affect hue of colors. A solution for such a problem requires the use of an optical film, causing a disadvantage. In particular, this problem becomes more remarkable with respect to double-face display which requires two optical films.

DISCLOSURE OF THE INVENTION

It is, therefore, an object of the present invention to enable double-face display with a relatively small driving voltage while effectively utilizing light generated in a light emitting layer and stabilizing the hue of colors.

A first aspect of the present invention provides an organic EL display device comprising a plurality of display elements formed on a substrate. Each of the display elements includes a first electrode segment formed on the substrate, an organic segment formed on the first electrode segment and having a light emitting element for generating light upon application of an electric field, and a second electrode segment formed on the organic element. The second electrode segment includes an opening for allowing passage of the light generated in the organic element.

The substrate and the first electrode segment may be transparent for example.

At least part of the opening maybe closed, for example, by a transparent closure layer. In this case, the closure layer may be made of a conductor held in conduction with the second electrode element.

The closure layer may be made of a metal for example. Examples of metal usable for this purpose includes gold or aluminum. The closure layer may be made of a metal layer having a thickness of 50 nm or less.

The organic EL display device according to the first aspect of the present invention may comprise a plurality of first strip electrodes extending in a first direction and each including a plurality of said first electrode segments arranged in a row extending in the first direction, and a plurality of second strip electrodes extending in a second direction transverse to the first direction and each including a plurality of said second electrode segments arranged in a row extending in the second direction. The opening may be provided in a respective one of the second electrodes at a position crossing a respective one of the first electrodes.

The opening may be generally square or rectangular. Preferably, a maximum dimension of the opening in the second direction may be made smaller than a dimension of a respective first electrode in the second direction.

A second aspect of the present invention provides an organic EL display device comprising a plurality of display elements formed on a substrate. Each of the display elements includes a light emitting element containing an organic compound for generating light upon application of an electric field, and a first and a second electrode segments for applying the electric field to the light emitting element. One of the first and second electrode segments includes a part located adjacent to the other electrode segment in a plane parallel to the substrate. The light emitting element covers both the first and second electrode segments.

Preferably, at least one of the first and second electrode segments may be transparent and may be made of a material having a resistance of less than $10^{-4}$ Ω·cm, for example.

At least one of the first and second electrode segments may be formed over the other electrode segment via an insulating film.

The organic EL display device according to the second aspect of the present invention may comprise a plurality of first strip electrodes each having a plurality of first electrode elements arranged in a row, a plurality of second strip electrodes formed over the first strip electrodes in crossing relationship thereto via an insulating layer and each having a plurality of second electrode elements arranged in a row.

Each of the first strip electrodes may serve as an anode while each of the second strip electrodes may serve as a cathode. In this case, the display device may comprise an anode-side functional element interposed between the first electrode segment and the light emitting element for providing at least one of a hole transporting function and a hole injecting function. Further, the display device may also comprise a cathode-side functional element interposed between the second electrode segment and the light emitting element for providing at least one of an electron transporting function and an electron injecting function.

Preferably, the anode-side functional element and the cathode-side functional element in each display element may be located adjacent to each other in a plane parallel to the substrate but are separated from each other by an insulating separator.

Preferably, at least one of the anode-side functional element and the cathode-side functional element may contain an additive for enhancing electroconductivity.

The organic EL display device according to the present invention may further comprise a cover for covering the plurality of display elements, and an anti-reflective film formed between the plurality of display elements and the cover for preventing light emitted from each of the display elements from being reflected on an inner surface of the cover.

In each of the first and second aspects, the substrate may be made of silicon.

BEST MODE FOR CARRYING OUT THE INVENTION

Figure 1:
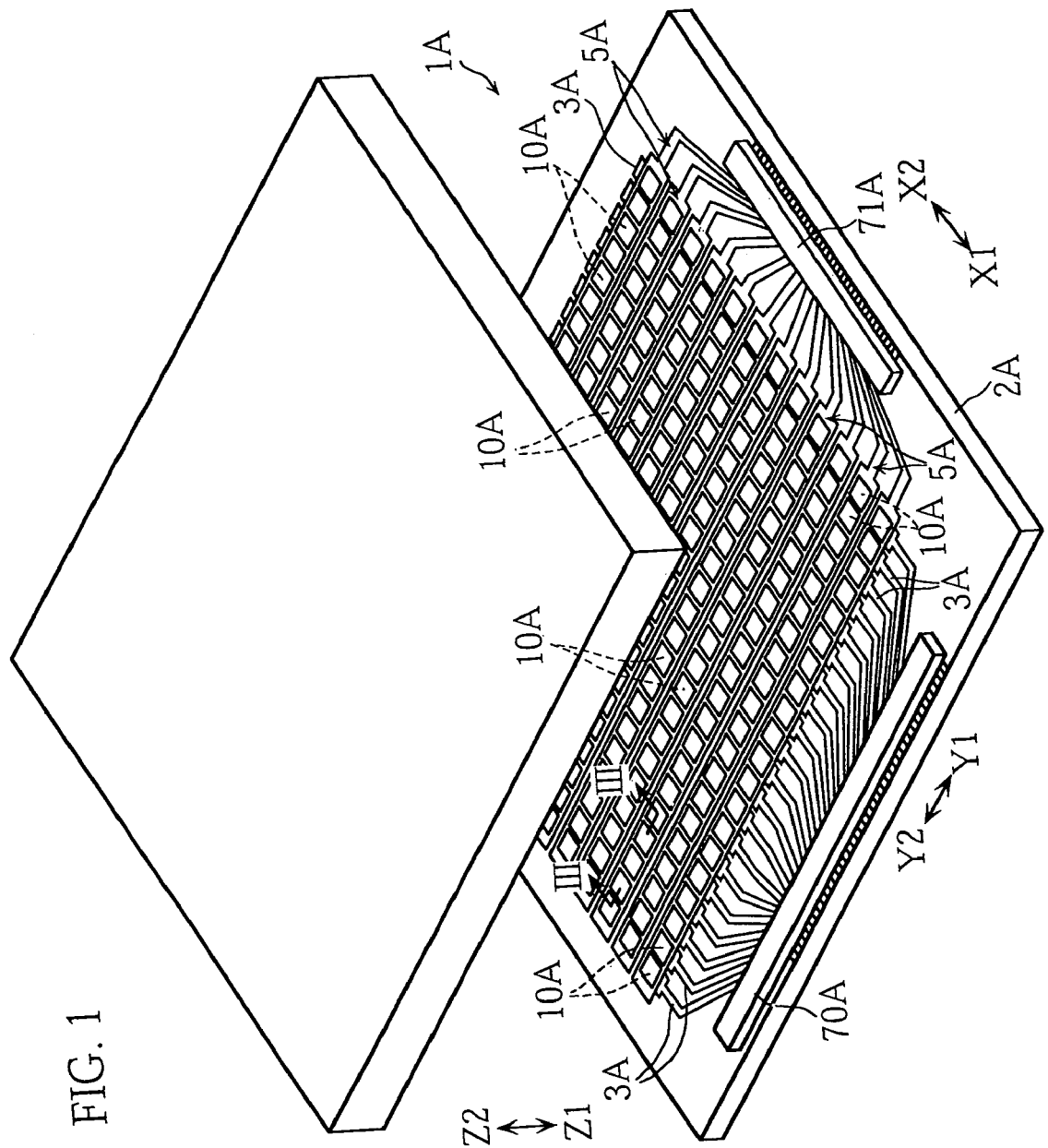
FIG. 1 is an exploded perspective view showing an organic EL display device according to a first embodiment of the present invention.
Figure 2:
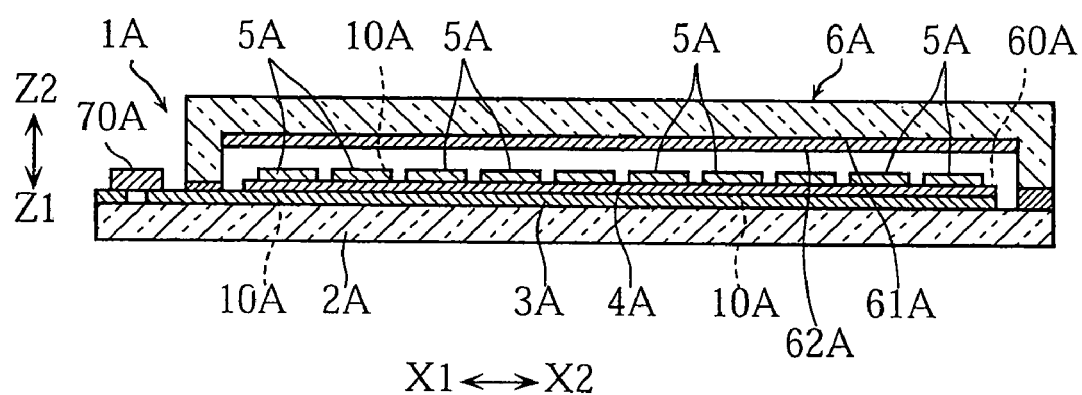
FIG. 2 is a sectional view of the organic EL display device shown in FIG. 1.

An organic EL display device 1A shown in FIG. 1 and FIG. 2 has a structure in which a plurality of display elements 10A are arranged in a matrix pattern. The display device is capable of displaying an image on its both surfaces by selectively actuating each display element 10A for light emission. The organic EL display device 1A includes a substrate 2A, a plurality of anodes 3A, a plurality of organic laminates 4A, a plurality of cathodes 5A, a cover 6A and driver ICs 70A, 70B.

The substrate 2A, although not clearly shown in the drawings, has e.g. a rectangular shape and is formed of glass, resin and the like to be entirely transparent.

Figure 3:
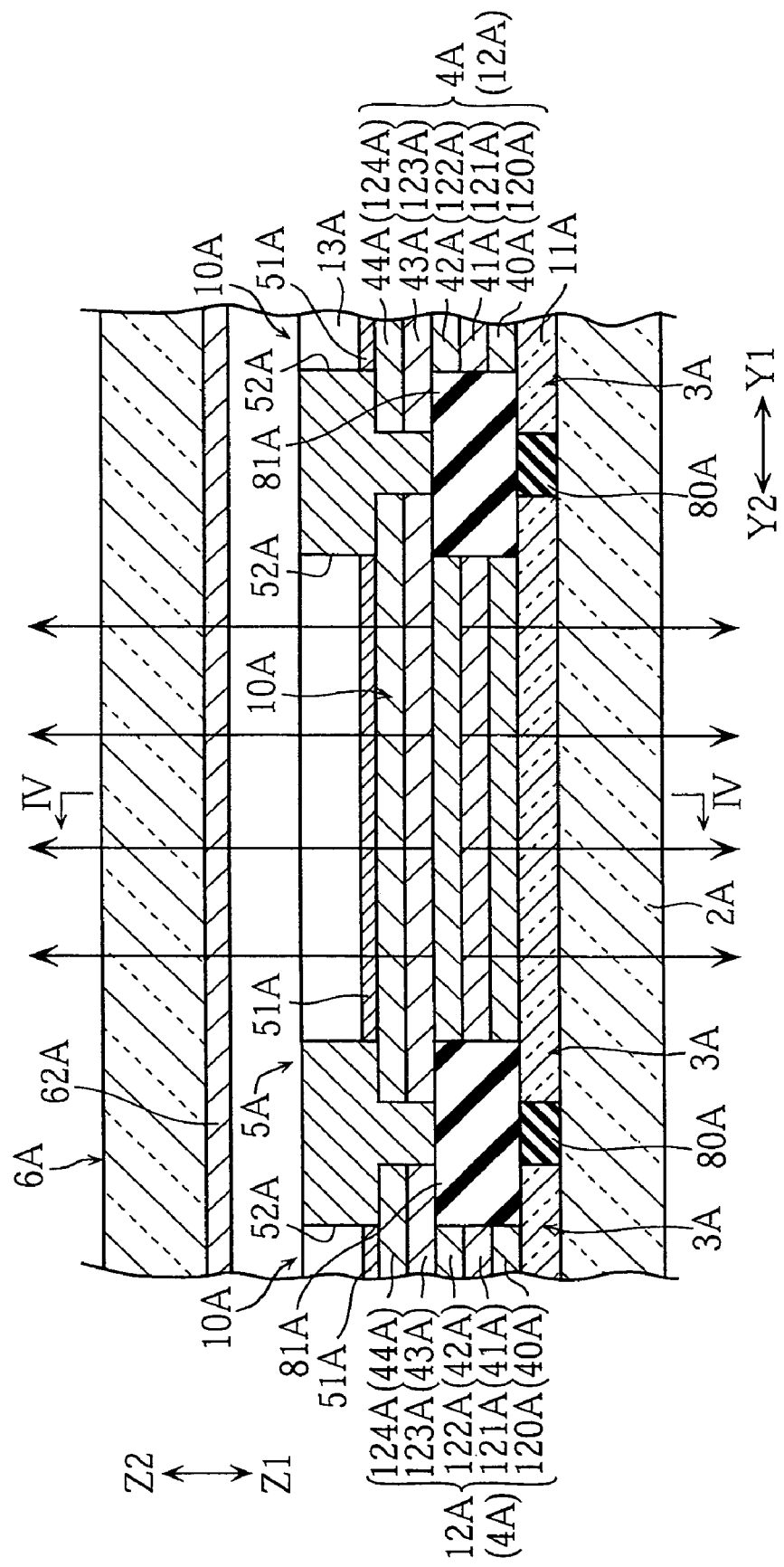
FIG. 3 is a sectional view taken along lines III-III in FIG. 1.

Each of the anodes 3A is formed on the substrate 2A in the form of a strip extending in an arrow X1-X2 direction. The anode 3A is made an electroconductive material such as ITO to be transparent. The anodes 3A are spaced from each other in an arrow Y1-Y2 direction in FIG. 1. As shown in FIG. 3, a separator 80A is arranged between each two adjacent anodes 3A. The separator 80A ensures electrical insulation between the respective anodes 3A.

The anodes 3A may be formed by a film forming method such as mask deposition or sputtering. The separators 80A may be formed simultaneously with forming the anodes 3A in the case where the anodes 3A are formed by photolithography with the use of a photoresist which is subsequently left in situ. Alternatively, the separators 80A may be formed by photolithography separately from the formation of the anodes 3A.

Figure 4:
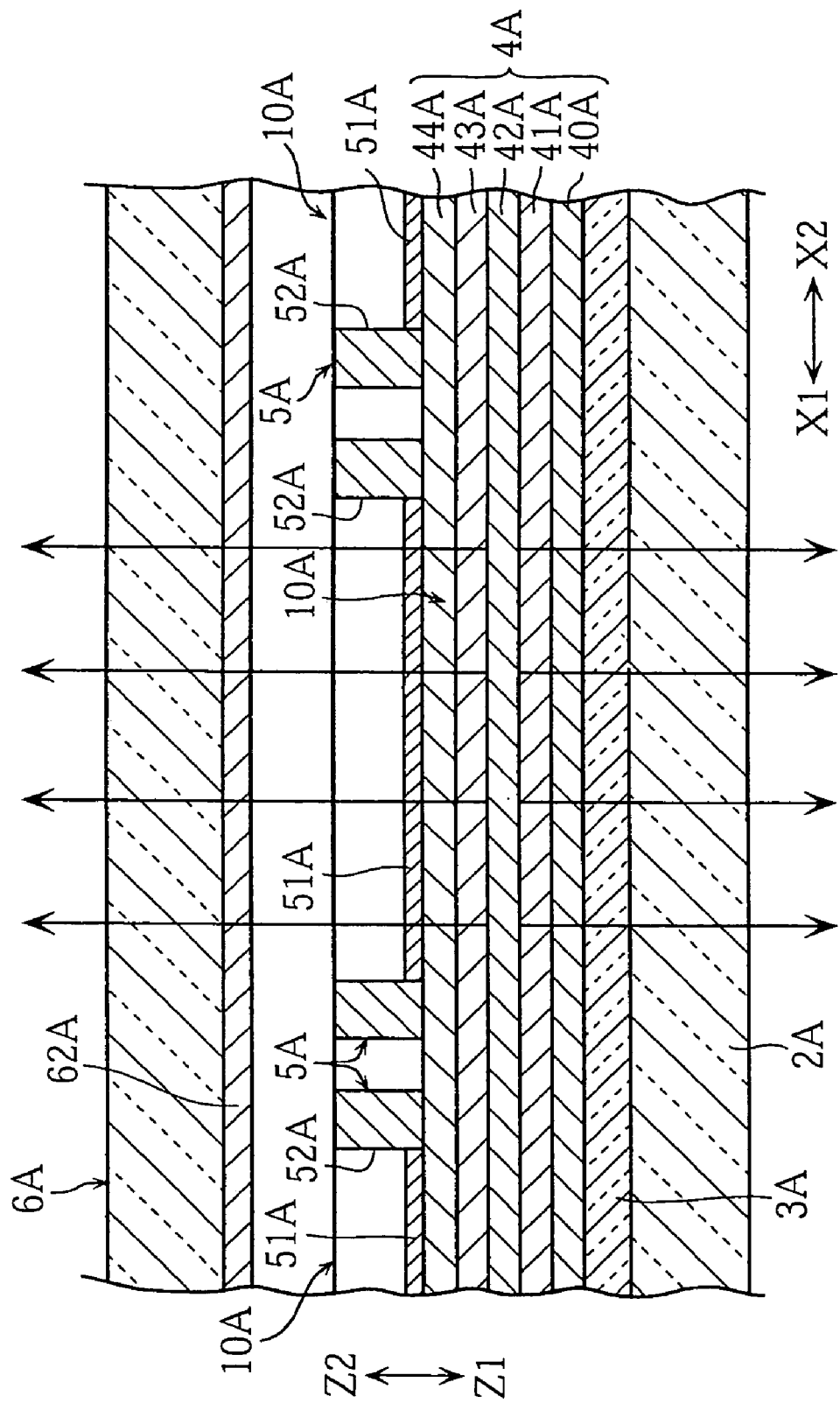
FIG. 4 is a sectional view taken along lines IV-IV in FIG. 3.

As shown in FIG. 2 and FIG. 4, each of the organic laminates 4A is formed on a corresponding anode 3A in the form of a strip extending in the X1-X2 direction. As shown in FIG. 3, the organic laminates 4A are spaced from each other in the Y1-Y2 direction, and a separator 81A is arranged between each two adjacent organic laminates 4A. The separator 81A ensures electrical insulation between the respective organic laminates 4A.

Each of the organic laminates 4A includes a hole injection layer 40A, a hole transport layer 41A, a light emitting layer 42A, an electron transport layer 43A and an electron injection layer 44A. The hole injection layer 40A enhances efficiency of hole injection from the anode 3A. The hole transport layer 41A transports positive holes while also serving as an electron barrier for preventing excitons from contacting the hole injection layer 40A. The light emitting layer 42A contains a luminescent substance and provides a field for generating excitons by recombination of electrons and positive holes. The electron transport layer 43A transports electrons to the light emitting layer 42A, while also serving as a hole barrier. The electron injection layer 44A enhances efficiency of electron injection from the cathode 5A.

If the organic EL display device 1A is intended for color display, the display device may comprise a plurality of sets of three adjacent light emitting layers 42A which include, for example, a red-light emitting layer, a green-light emitting layer and a blue-light emitting layer. In this case, each of the red-light emitting layer, the green-light emitting layer and the blue-light emitting layer may include a luminescent substance for emitting respectively colored light. Alternatively, a respectively colored optical filter may be formed over each of the respective light emitting layers in a set.

The layers 40A-44A of the organic laminates 4A may be formed by a film forming method such as vapor deposition or sputtering. The materials for the respective layers 40A-44A may be selected from various known materials.

The separators 81A, as is the case with the separator 80A previously described, may be formed simultaneously with forming the organic layers 4A by causing a photo resist used for forming the organic layers 4A to remain in situ. Alternatively, the separators 81A may be formed by photolithography separately from the formation of the organic layers 4A, or the separators 81A may be formed concurrently with the separators 80A at the time of forming the anodes 3A.

As shown in FIG. 1 and FIG. 2, each of the cathodes 5A extends perpendicularly to the anodes 3A in the arrow Y1-Y2 direction. The cathodes 5A are spaced from each other in the X1-X2 direction.

As shown in FIG. 3 and FIG. 4, each of the cathodes 5A includes a plurality of openings 52A. The openings 52A allow light generated at the light emitting layer 42A to exit in a direction Z2. As shown in FIG. 1, the openings 52A of each cathode 5A are spaced from each other in the Y1-Y2 direction in corresponding relationship to the arrangement of the display elements 10A. As better shown in FIG. 3., the dimension of each opening 52A in the Y1Y2 direction is smaller than the dimension of the anode 3A in the Y1-Y2 direction. This allows light to exit uniformly from the entire opening 52A. However, the shape of the opening 52A is not limited to the one shown in the drawings and may be modified variously as long as an intended amount of light is emitted.

As shown in FIG. 3 and FIG. 4, a metal conductive layer 51A is provided to protect a respective one of the organic laminates 4A while compensating for a resistance increase and a decrease of contact area of each cathode 5A with the organic laminate 4A (the electron injection layer 44A) caused by the provision of each opening 52A in the cathode 5A. The metal conductive layer 51A is formed within the opening 52A in contact with the cathode 5A so as to cover the electron injection layer 44A.

The metal conductive layer 51A is transparent for avoiding interruption of light emission through each opening 52A. The metal conductive layer 52A may comprise a metal film having a thickness of no more than 50 nm for example.

The metal conductive layer 51A may be omitted when the resistance of each cathode 5A is sufficiently small.

For favorable electron injection into the organic laminate 4A, the cathodes 5A and the metal conductive layer 51A are preferably made of a material having a relatively small value in work function as well as in electron affinity. Examples of materials for making the cathodes 5A and the metal conductive layer 51A include gold, aluminum, magnesium-silver alloys and aluminum-lithium alloys. Of these, gold and aluminum are particularly preferable for making the metal conductive layer 51A.

The cathodes 5A and the metal conductive layer 51A may be made by a film forming method such as vapor deposition or sputtering. Preferably, the cathodes 5A and the metal conductive layer 51A may be prepared with the use of a metal mask. The metal mask eliminates the need for removing an unwanted photomask by etching, thereby reducing damages to the organic laminates 4A previously formed. However, it is necessary to make the cathodes 5A by a two-stage deposition process using two kinds of masks. Specifically, the cathodes 5A have parts extending in the X1-X2 direction and parts extending in the Y1-Y2 direction, necessitating separate masks having differently shaped openings.

As shown in FIG. 2, the cover 6A inhibits water ingress into the organic laminates 4A while preventing adhesion of foreign substances such as dust to the cathodes 5A or the like. The cover 6A provides an inner space 60A and is entirely transparent. The cover 6A may be made by a resin molding process using a transparent resin for example.

The cover 6A is bonded to the substrate 2A with the display elements 10A housed in the inner space 60A. Such bonding of the cover 6A to the substrate 2A may be done by using a resin adhesive or by fusion bonding or the like.

The cover 6A has an inner surface 61A provided with an anti-reflective film 62A. The anti-reflective film 62A allows transmission of light incident at a predetermined range of angle, thereby avoiding the situation in which light emitted from the light emitting layer 42A (the display element 10A) reflects on the inner surface of the cover 6A to go astray. The anti-reflective film 62A may be made by applying an anti-reflective film which utilizes light interference, or by AR treatment for depositing a low refractive index material.

The display elements 10A are defined as areas where the cathodes 5A and the anodes 3A cross each other, and each include an anode segment 11A, an organic segment 12A and a cathode segment 13A. More specifically, each anode 3A provides a plurality of anode segments 11A aligned in the X1-X2 direction, whereas each cathode 5A provides a plurality of cathode segments 13A aligned in the Y1-Y2 direction. Similarly, each organic laminate 4A provides a plurality of organic segments 12A aligned in the X1-X2 direction. Each organic segment 12A includes a hole injection element 120A, a hole transport element 121A, a light emitting element 122A, an electron transport element 123A and an electron injection element 124A.

As shown in FIG. 1, the driver ICs 70A, 71A are provided to control a voltage applied between the anode segment 11A and cathode segment 11C (see FIG. 3 and FIG. 4) of each display element 10A. The driver IC 70A successively applies a scanning voltage to the respective anodes 3A and is mounted on the substrate 2A in conduction with the respective anodes 3A. The driver IC 71A supplies a signal voltage to the respective cathodes 5A in synchronism with clock pulses depending on the image to be displayed. The driver IC 71A is mounted on the substrate 2A in conduction with the respective cathodes 5A.

When the driver ICs 70A, 71A applies a voltage of not smaller than a threshold value across the anode segment 11A and cathode segment 13A of a respective display element 10A shown in FIG. 3 and FIG. 4, holes are injected from the anode segment 11A into the hole injection element 120A while electrons are injected from the cathode segment 13A into the electron injection element 124A. Then, the injected holes are transported to the light emitting element 122A via the hole transport element 121A while the injected electrons are transported to the light emitting element 122A via the electron transport element 123A. In the light emitting element 122A, the electrons and the holes recombine with each other to create excitons which migrate within the light emitting element 122A. As a result, the excitons radiate an energy corresponding to a band gap of the luminescent material, thereby causing the luminescent material, i.e., the light emitting element 122A, to generate light.

The light emitted from the light emitting element 122A include light components propagating in the directions Z1 and Z2. The light component propagating in the direction Z1 passes through the hole transport element 121A, the hole injection element 120A, the anode element 11A and the substrate 2A for exiting out of the organic EL display device 1A. The light component propagating in the direction Z2, on the other hand, passes the electron transport element 123A, the electron injection element 124A and the opening 52A (the metal conductive layer 51A), further passes through the anti-reflective film 62A and the cover 6A for exiting out of the organic EL display device 1A. Thus, the organic EL display device 1A allows the light generated in the light emitting element 122A to be emitted in two directions, i.e., the direction Z1 and the direction Z2, thereby achieving double-face display.

Figure 7:
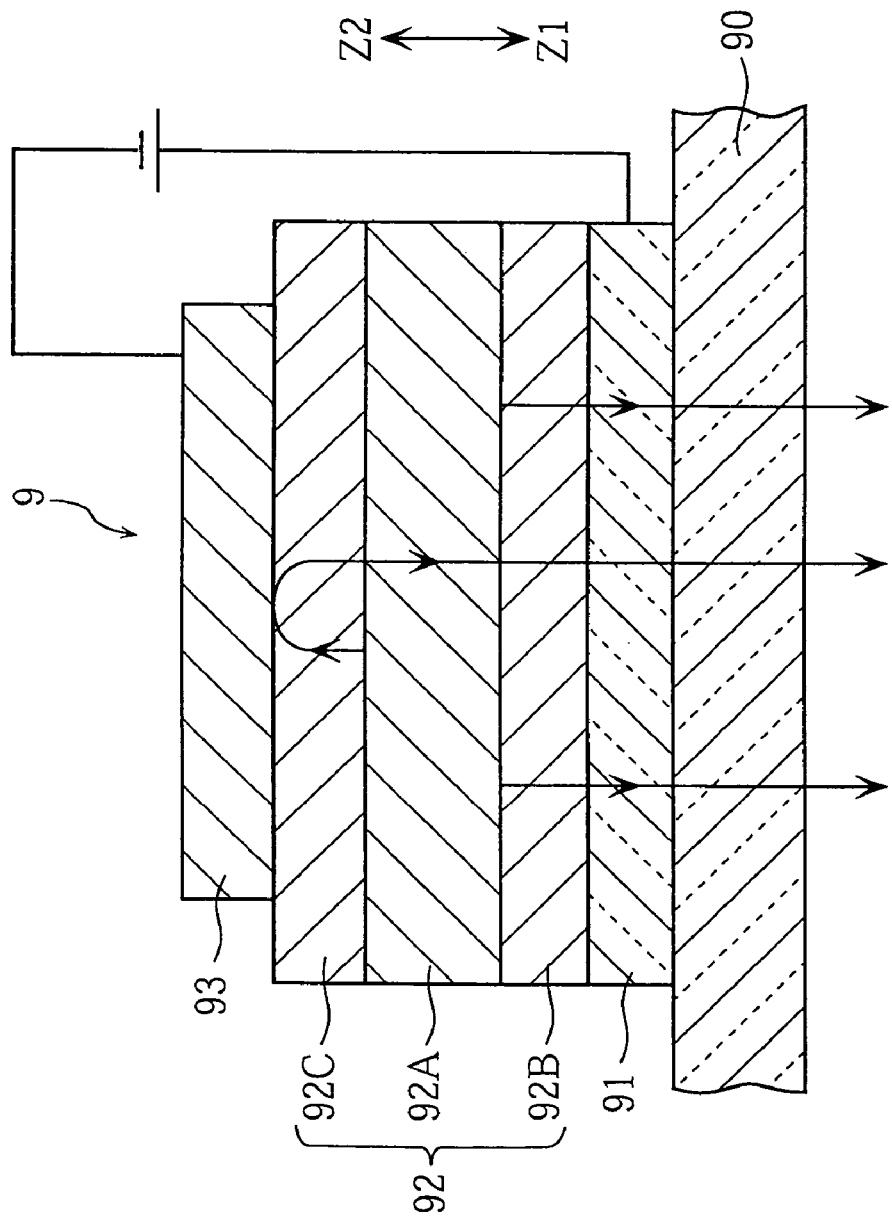
FIG. 7 is a sectional view schematically showing an essential part for explaining an example of conventional organic EL display device.

In the organic EL display device 1A, the light component propagating in the direction Z2 can be taken out of the device without reflecting at the anode 3A and the cathode 5A. Accordingly, when compared with the organic EL display device 9 (see FIG. 7) wherein the light component running in the direction Z2 is reflected on the reflective electrode segment 93 for emission only in the direction Z1, the light component running in the direction Z2 needs only to pass a smaller number of layers in the organic EL display device 1A before exiting out of the device. Thus, as far as the light component running in the direction Z2 is concerned, the organic EL display device 1A can reduce the amount of light to be absorbed before emission out of the device.

Moreover, the light component running in the direction Z2 exits out from the display element 10A after passing the electron transport element 123A, the electron injection element 124A and the opening 52A (the metal conductive layer 51A). The metal conductive layer 51A may be made of a thin metal film to be light-pervious. Accordingly, it is possible to provide the metal conductive layer 51A as a layer having a low wavelength selectivity. In such a case, a hue change of exit light caused by passage through the metal conductive layer 51A can be restricted without the need for using an optical filter. It is also possible to allow light to exit from the display element 10A via the opening 52A in the absence of the metal conductive layer 51A. In this case, again, a hue change of exit light can be prevented.

Next, referring to FIG. 5 and FIG. 6, a description will be given of an organic EL display device according to a second embodiment of the present invention.

Figure 5:
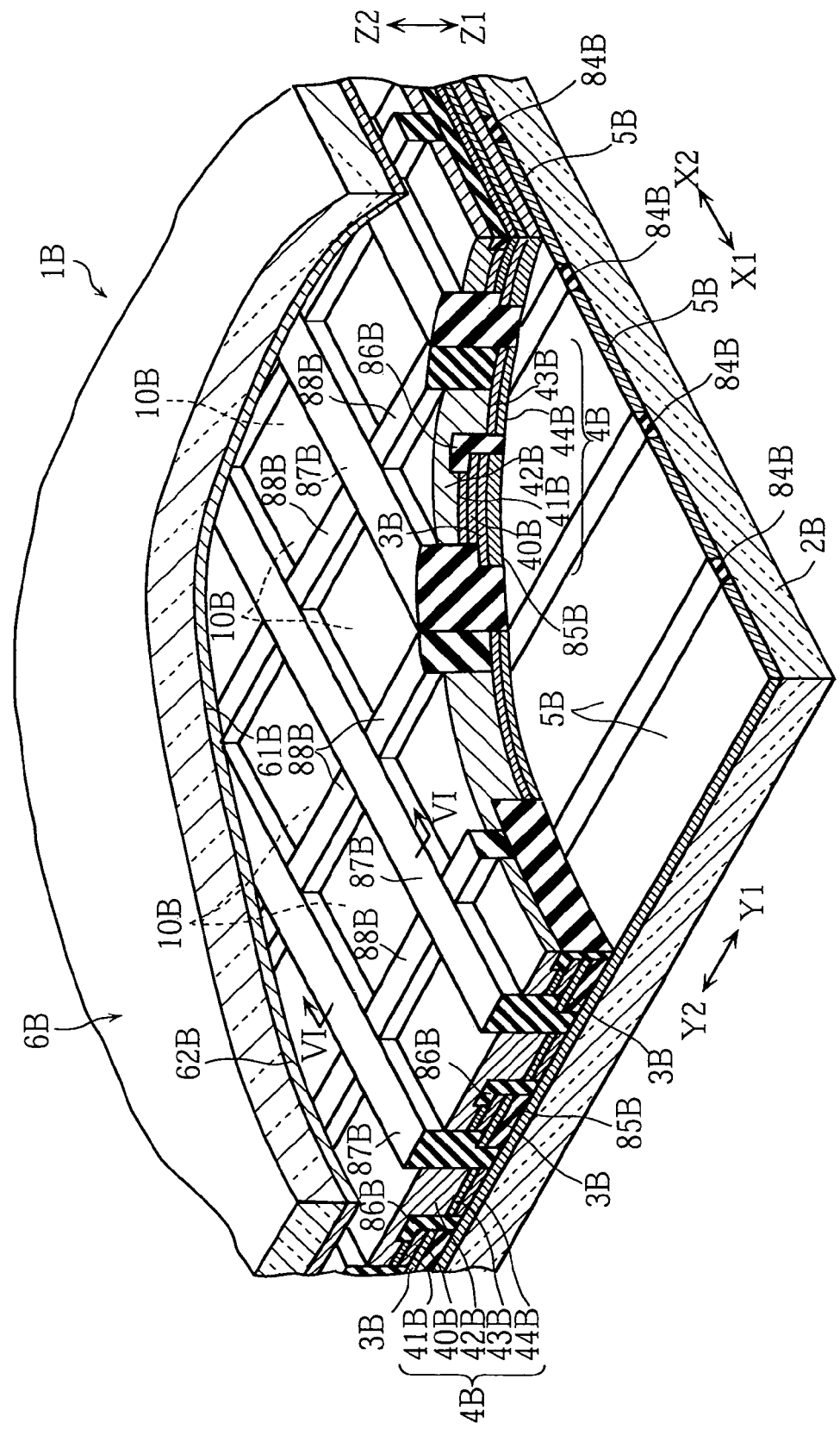
FIG. 5 is an essential perspective view showing an organic EL display device according to a second embodiment of the present invention.
Figure 6:
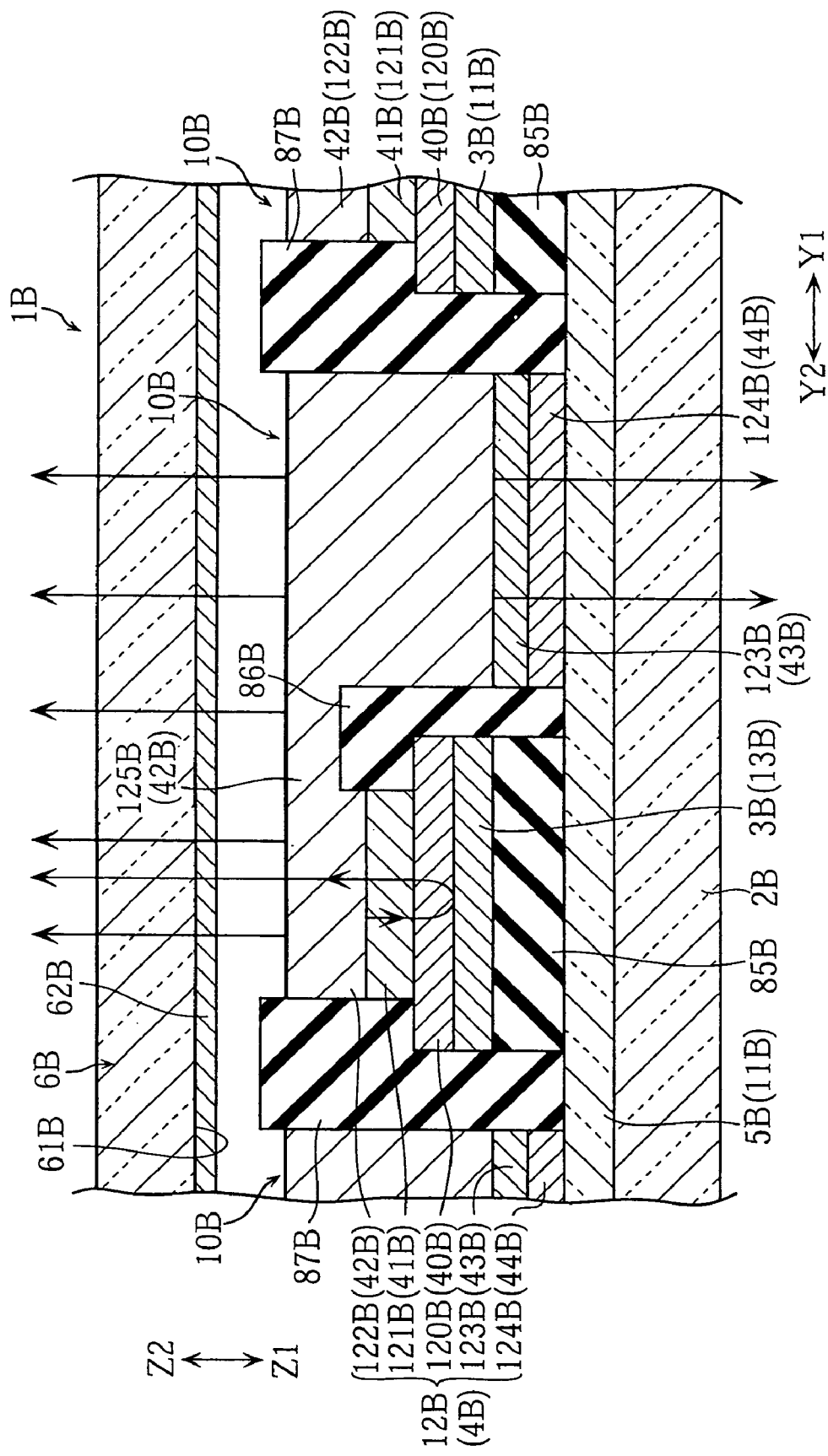
FIG. 6 is a sectional view taken along lines VI-VI in FIG. 5.

As with the organic EL display device 1A (see FIGS. 1-4) previously described, the organic EL display device 1B shown in FIG. 5 and FIG. 6 has a structure in which a plurality of display elements 10B are arranged in a matrix pattern. The display device is capable of displaying an image on its both surfaces by selectively actuating each display element 10B for light emission. The organic EL display device 1B includes a transparent substrate 2B, a plurality of anodes 3B, a plurality of organic laminates 4B, a plurality of cathodes 5B and a cover 6B.

Each of the cathodes 5B is provided on the substrate 2B in the form of a strip extending in an arrow Y1-Y2 direction and spaced from each other in an arrow X1-X2 direction. The cathodes 5B respectively include a plurality of cathode segments 13B and are made transparent. Between each two adjacent cathodes 5B, there is provided a separator 84B for electrically insulating the respective cathodes 5B. The cathodes 5B may be made of the same material by the same method as the anodes 3A of the organic EL display device 1A (see FIGS. 1-4) according to the first embodiment.

Each of the anodes 3B is provided in the form of a strip extending perpendicularly to the cathodes 5B in the arrow X1-X2 direction. Each of the anodes 3B is formed over the cathodes 5B via a separator 85B and includes a plurality of anode segments 11B. The anodes 3B are spaced from each other in the Y1-Y2 direction. The anodes 3B may be made of the same material as the cathodes 5A of the organic EL display device 1A (see FIGS. 1-4) previously described.

The organic laminates 4B are each provided as a strip extending in the X1-X2 direction, and are spaced from each other in the Y1-Y2 direction. Each of the organic laminates 4B includes a hole injection layer 40B, a hole transport layer 41B, a plurality of light emitting layers 42B, an electron transport layer 43B and an electron injection layer 44B. The layers 40B-44B of the organic laminate 4B serve the same purpose and are made by the same process as the respective layers 40A-44A of each organic laminate 4A in the organic EL display device 1A (see FIGS. 3 and 4) previously described.

The hole injection layer 40B and the hole transport layer 41B are laminated in the mentioned order on a corresponding anode 3B as strip extending in the arrow X1-X2 direction in FIG. 5. At least one of the hole injection layer 40B and the hole transport layer 41B may preferably contain a conductivity enhancing additive compound. Examples of such compounds include halogens and Lewis acids. An example of Lewis acids may be $FeCl_3$.

Each of the electron injection layer 44B and the electron transport layer 43B is provided as a strip extending in the X1-X2 directions in an area adjacent to a respective one of the anodes 3B. The electron injection layer 44B and the electron transport layer 43B are laminated over the plurality of cathodes 5B in serial conduction therewith. At least one of the electron injection layer 44B and the electron transport layer 43B preferably contain a conductivity enhancing additive compound. Examples of such compounds include alkali metals, ammonia or electroconductive polymers. Examples of electroconductive polymers include polyanilline and polythiophene.

In each display element 10B, a separator 86B is provided at an area for separating a respective anode 3B (the hole injection layer 40B and the hole transport layer 41B) from the electron injection layer 44B and the electron transport layer 43B. Also, each two adjacent display elements 10B are separated from each other in the Y1-Y2 direction by a separator 87B.

Each light emitting layer 42B is formed over the hole transport layer 41B and the electron transport layer 43B to cover both layers 41B, 43B. Each two light emitting layers 42B adjoining in the X1-X2 direction are separated by a separator 88B.

Each of the organic laminates 4B includes a plurality of organic segments 12B. Each of the organic segments 12B as a whole covers the corresponding elements of a respective anode 3B and a respective cathode 5B. The organic segment 12B includes: a hole injection element 120B and a hole transport element 121B both covering the anode segment 13B; a light emitting element 122B covering both the anode segment 13B and the cathode segment 15B; and an electron transport element 123B and an electron injection element 124B for covering the cathode element 5B.

When the organic EL display device 1B is intended for color display, the display device may comprise a plurality of sets of three adjacent light emitting layers 42B which include, for example, a red-light emitting layer, a green-light emitting layer and a blue-light emitting layer. In this case, each of the red-light emitting layer, the green-light emitting layer and the blue-light emitting layer may contain a luminescent substance for emitting respectively colored light. Alternatively, a respectively colored optical filters may be formed over each of the respective light emitting layers.

The cover 6B is provided for the same purpose as the cover 6A in the first embodiment (see FIGS. 1-4), and has an anti-reflective film 62B formed on its inner surface 61B. The anti-reflective film 62B is provided for the same purpose as the anti-reflective film 62A of the first embodiment (see FIGS. 2-4).

In the display element 10B of the organic EL display element 1B, light is generated in the light emitting element 122B upon recombination of electrons and holes, as is the case with the organic EL display device 1A previously described. The light generated in the light emitting element 122B include light components running in the direction Z1 and the direction Z2 in FIG. 6. The light component running in the direction Z2 passes through the anti-reflective film 62B and the cover 6B for exiting out of the organic EL display device 1B as light running in the direction Z2. On the other hand, a part of the light component running in the direction Z1 passes the electron transport layer 43B, the hole injection layer 44B, the cathode 5B and the substrate 2B for exiting out of the organic EL display element 1B as light running in the direction Z1, whereas the remaining part of the light component running in the direction Z1 passes through the hole transport layer 41B and the hole injection layer 40B for reflecting on the anode 3B, and then returns through the hole injection layer 40B, the hole transport layer 41B and the light emitting layer 42B for exiting out of the organic EL display device 1B as light running in the direction Z2. Hence, the organic EL display device 1B allows light generated in the light emitting layer 42B to be emitted in the two directions Z1 and Z2, thereby achieving double-face display.

In the organic EL display device 1B, as is the case with the organic EL display device 1A previously described, the light component running in the direction Z2 can be taken out of the device without reflecting at the anode 3B or the cathode 5B. As a result, the light component emitted from the organic EL display device 1B to run in the direction Z2 suffers decreased absorption of light before exiting out of the device.

Moreover, in the organic EL display device 1B, the light component running in the direction Z2 exits without passing the anode 3B and the cathode 5B, nor passing the layers 40B, 41B, 43B, 44B, other than the light emitting layer 42B, of the organic laminate 4B. Therefore, the light component emitted from the organic EL display device 1B to run in the direction Z2 only undergoes a limited hue change of color without using an optical filter.

The organic EL display device 1A, 1B according to each of the first and second embodiments may be modified to emit light only in the direction Z2 by making opaque the anode 3A, 3B or the substrate 2A, 2B. In this case, it is preferable to make the anode 3A in the organic EL display device 1A or the cathode 5B in the organic EL display device 1B with a metal material having a high reflectance for effectively utilizing light generated in the light emitting layer 42A, 42B. For this purpose, the anode 3A or the cathode 5B, or ultimately the substrate 2A, 2B may be made of a material selected from a wide range of candidates. Hence, it is no longer essential to use a transparent material having a high wavelength selectivity such as ITO for making the anode 3A in the organic EL display device 1A or the cathode 5B in the organic EL display device 1B. In each of the organic EL display devices 1A, 1B, the light component emitted in the direction Z1 suffers only a limited hue change of color. Meanwhile, if the substrate 2A, 2B may be made non-transparent, use may be made of a material having a high thermal diffusion such as silicon for making the substrate 2A, 2B. In that case, the organic EL display device 1A, 1B provides a better heat diffusion, thereby restraining a deterioration of the organic EL display devices 1A, 1B due to thermal influences for prolonging the service life of the organic EL display devices 1A, 1B.

The present invention is not limited to the organic EL display devices 1A, 1B according to the above first and second embodiments previously described, but may be modified variously. For example, it suffices if the organic laminate 4A, 4B of the organic EL display device 1A, 1B includes at least a light emitting layer 42A, 42B, so that the other layers may be omitted partially or totally. To mention a more concrete example, the organic laminate may have a two-layer structure including a combination of a hole transport layer and a light emitting layer, or another combination of an electron transport layer and a light emitting layer. Alternatively, the organic laminate may have a three-layer structure including a hole transport layer, an electron transport layer and a light emitting layer.

The invention claimed is:

1. An organic EL display device comprising a plurality of display elements formed on a transparent substrate;
   wherein each of the display elements includes a transparent first electrode segment formed on the substrate, an organic segment formed on the first electrode segment and having a light emitting element for generating light upon application of an electric field, and a second electrode segment formed on the organic element;
   wherein the second electrode segment includes an opening for allowing the light generated in the organic segment to pass in a first direction;
   wherein the substrate and the first electrode allows the light generated in the organic segment to pass in a second direction opposite to the first direction;
   wherein at least part of the opening is closed by a transparent closure layer; and
   wherein the closure layer is made of a conductor held in conduction with the second electrode segment.

2. The organic EL display device according to claim 1, wherein the closure layer comprises a metal layer having a thickness of 50 nm or less.

3. The organic EL display device according to claim 2, wherein the closure layer is made of gold or aluminum.

4. The organic EL display device according to claim 1, which comprises a plurality of first strip electrodes extending in a first direction and each including a plurality of said first electrode segments arranged in a row extending in the first direction, and a plurality of second strip electrodes extending in a second direction transverse to the first direction and each including a plurality of said second electrode segments arranged in a row extending in the second direction,
   wherein the opening is provided in a respective one of the second electrodes at a position crossing a respective one of the first electrodes.

5. The organic EL display device according to claim 4, wherein the opening is generally square or rectangular.

6. The organic EL display device according to claim 4, wherein a maximum dimension of the opening in the second direction is smaller than a dimension of a respective first electrode in the second direction.

7. The organic EL display device according to claim 1, further comprising:
   a cover for covering the plurality of display elements;
   an anti-reflective film formed between the plurality of display elements and the cover for preventing light emitted from each of the display elements from being reflected on an inner surface of the cover.

8. An organic EL display device comprising a plurality of display elements formed on a substrate;
   wherein each of the display elements includes a first electrode segment formed on the substrate, an organic segment formed on the first electrode segment and having a light emitting element for generating light upon application of an electric field, and a second electrode segment formed on the organic segment, the second electrode segment including an opening for allowing passage of the light generated in the organic element; and
   wherein at least part of the opening is closed by a transparent conductor layer held in conduction with the second electrode segment.

9. An organic EL display device comprising a plurality of display elements formed on a substrate;
   wherein each of the display elements includes a first electrode segment formed on the substrate, an organic segment formed on the first electrode segment and having a light emitting element for generating light upon application of an electric field, and a second electrode segment formed on the organic segment;
   wherein the second electrode segment includes an opening for allowing passage of the light generated in the organic element;
   wherein the organic EL display device comprises a plurality of first strip electrodes extending in a first direction and each including a plurality of said first electrode segments arranged in a row extending in the first direction, and a plurality of second strip electrodes extending in a second direction transverse to the first direction and each including a plurality of said second electrode segments arranged in a row extending in the second direction; and
   wherein the opening is provided in a respective one of the second electrodes at a position crossing a respective one of the first electrodes.

* * * * *